(12) United States Patent
Hao (10) Patent No.: US 10,192,909 B2
(45) Date of Patent: Jan. 29, 2019

(54) ARRAY SUBSTRATE STRUCTURE AND MANUFACTURING METHOD OF ARRAY SUBSTRATE

(71) Applicant: Shenzhen China Star Optoelectronics Semiconductor Display Technology Co., Ltd., Shenzhen (CN)

(72) Inventor: Sikun Hao, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/570,374

(22) PCT Filed: May 18, 2017

(86) PCT No.: PCT/CN2017/084975
§ 371 (c)(1),
(2) Date: Oct. 30, 2017

(87) PCT Pub. No.: WO2018/192052
PCT Pub. Date: Oct. 25, 2018

(65) Prior Publication Data
US 2018/0301482 A1    Oct. 18, 2018

(30) Foreign Application Priority Data

Apr. 17, 2017 (CN) .......................... 201710249966.2

(51) Int. Cl.
*H01L 27/12* (2006.01)
*G02F 1/1343* (2006.01)
*G02F 1/1362* (2006.01)

(52) U.S. Cl.
CPC ...... *H01L 27/1288* (2013.01); *G02F 1/13439* (2013.01); *G02F 1/134363* (2013.01);
(Continued)

(58) Field of Classification Search
CPC ............... H01L 27/1288; H01L 27/124; G02F 1/13439; G02F 1/134363; G02F 1/136227; G02F 1/136286; G01F 2001/13625
(Continued)

(56) References Cited

U.S. PATENT DOCUMENTS

2006/0290865 A1    12/2006 Choi et al.

FOREIGN PATENT DOCUMENTS

| CN | 101000896 A | 7/2007 |
|---|---|---|
| CN | 101957529 A | 1/2011 |

(Continued)

*Primary Examiner* — Anthony Ho
(74) *Attorney, Agent, or Firm* — Leong C. Lei (57) ABSTRACT

The present invention involves an array substrate structure and a manufacturing method of an array substrate. The manufacturing method of an array substrate, which comprises: Step 1, a substrate is provided, a first metal layer is manufactured on the substrate, and the first metal layer is patterned with a first photo-mask, to manufacture a gate electrode. Step 2, a gate insulating layer is manufactured on the substrate; an active layer is manufactured with a second photo-mask. Step 3, a first via is formed in the gate insulating layer corresponding to the first metal layer with a third photo-mask. Step 4, a second metal layer is manufactured on the gate insulating layer, the second metal layer is patterned with a fourth photo-mask, to manufacture source/drain electrodes, and a second via is formed on where corresponding to the active layer, the first metal layer and the second metal layer are connected at the first via. Step 5, a pixel electrode is manufactured with a fifth photo-mask, the pixel electrode (Continued)

and the source/drain electrodes are directly connected at the second via; the second metal layer is covered and protected by the pixel electrode. The present invention also provides a corresponding array substrate structure. The invention can enhance the aperture ratio of the pixel at high-resolution and the display effect and quality of the liquid crystal display and improve the electrical characteristics of the panel.

10 Claims, 6 Drawing Sheets (52) U.S. Cl.
CPC .. *G02F 1/136227* (2013.01); *G02F 1/136286* (2013.01); *H01L 27/124* (2013.01); *G02F 2001/13625* (2013.01); *G02F 2201/121* (2013.01)

(58) Field of Classification Search
USPC .......................................................... 438/155
See application file for complete search history.

(56) References Cited

FOREIGN PATENT DOCUMENTS

| | | |
|---|---|---|
| CN | 102033343 A | 4/2011 |
| CN | 102299104 A | 12/2011 |
| CN | 103227148 A | 7/2013 |
| CN | 103928469 A | 7/2014 |

1 — A substrate is provided, a first metal layer is manufactured on the substrate, the first metal layer is patterned with a first photo-mask, to manufacture a gate electrode.

2 — A gate insulating layer is manufactured on the substrate, an active layer is manufactured with a second photo mask.

3 — A first via is formed in the gate insulating layer corresponding to the first metal layer with a third photo mask.

4 — a second metal layer is manufactured on the gate insulating layer, the second metal layer is patterned with a fourth photo-mask, to manufacture source/drain electrodes, and a second via is formed on where corresponding to the active layer, the first metal layer and the second metal layer are connected at the first via 5 — A pixel electrode is manufactured with a fifth photo mask, the pixel electrode and the source/drain electrodes are directly connected at the second via, the second metal layer is covered and protected by the pixel electrode

FIG. 6

ARRAY SUBSTRATE STRUCTURE AND MANUFACTURING METHOD OF ARRAY SUBSTRATE

BACKGROUND OF THE INVENTION

Field of Invention

The present invention relates to the field of liquid crystal display, and more particularly to an array substrate structure and a manufacturing method of an array substrate.

Description of Prior Art

LCDs are currently the most widely used flat panel displays, has gradually become a variety of electronic devices such as mobile phones, personal digital assistants (PDA), digital camera, computer screen or laptop screen is widely used with high-resolution color screen monitor. Currently liquid crystal displays commonly used, usually the upper and lower liquid crystal substrate and the intermediate layer, the substrate has a composition of glass and the electrode. If the upper and lower substrates both have display electrodes may be formed of the longitudinal electric field mode, such as Twist Nematic (TN) mode, Vertical Alignment (VA) mode, and Multi-domain Vertical Alignment (MVA) mode developed for solving an over-narrow viewing angle. Another type different from said display device, the electrode only on one side of the substrate, a transverse electric field mode display, such as IPS (In-plane switching, in-plane switching) mode, Fringe Field Switching (FFS) mode.

Thin-film transistor displays are used by large-size LCD panels such as LCD TVs for its high aperture ratio, high resolution, wide viewing angle and other features, but in the high-resolution panels, the pixel designed with the conventional manufacturing method has lower aperture ratio and the gate driver on array (GOA) has wider frames.

Figure 1:
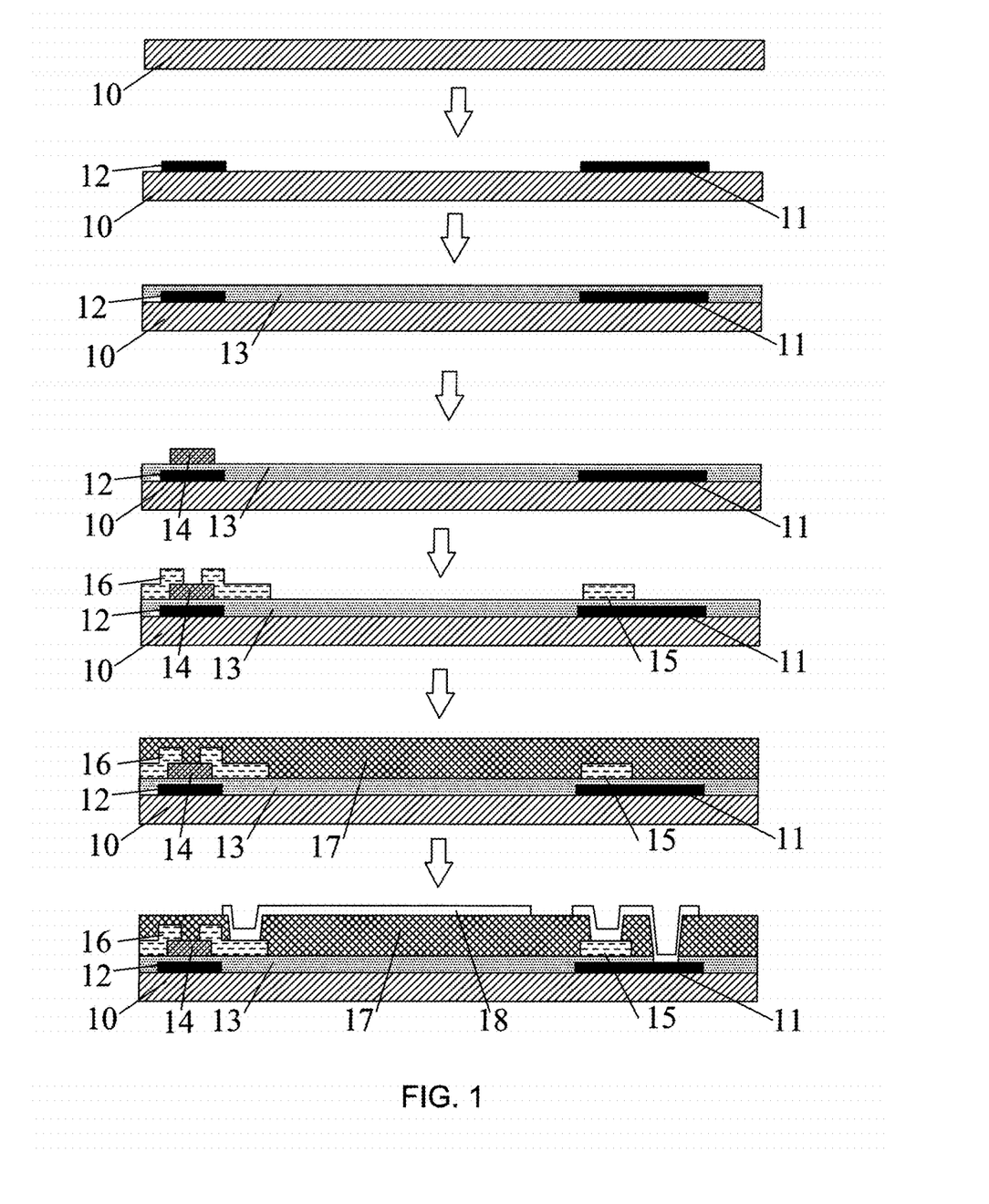
FIG. 1, which is a schematic view of a conventional array substrate with 5 photo-mask process.

Please refer to FIG. 1, which is a schematic view of a conventional array substrate with 5 photo-mask process. The conventional 5 photo-mask process mainly includes: a substrate 10 is provided, a first metal layer 11 is manufactured on the substrate 10, the first metal layer 11 is patterned by a first photo-mask, a gate electrode 12 is manufactured, scanning lines and common electrode lines can be formed on where the first metal layer 11 excluding the gate electrode 12; a gate insulating layer (GI) 13 is manufactured on the substrate 10, an active layer 14 is manufactured by a second photo-mask; a second metal layer 15 is prepared by forming a second metal layer 15, A second metal layer 15 is patterned by a third photo-mask, to manufacture source/drain electrodes 16, data lines and the like may be formed on where the second metal layer 15 excluding the source/drain electrodes 16; a protective layer 17 is manufactured, vias are formed on the protective layer 17 with the fourth photo-mask, and the position of the vias corresponds to the source/drain electrodes 16, a pixel electrode 18 is formed on a portion of the first metal layer 11 and the second metal layer 15 of the liquid crystal display peripheral-driving circuit with the fifth photo-mask, and the pixel electrode may be formed by indium tin oxide (ITO).

Figure 2:
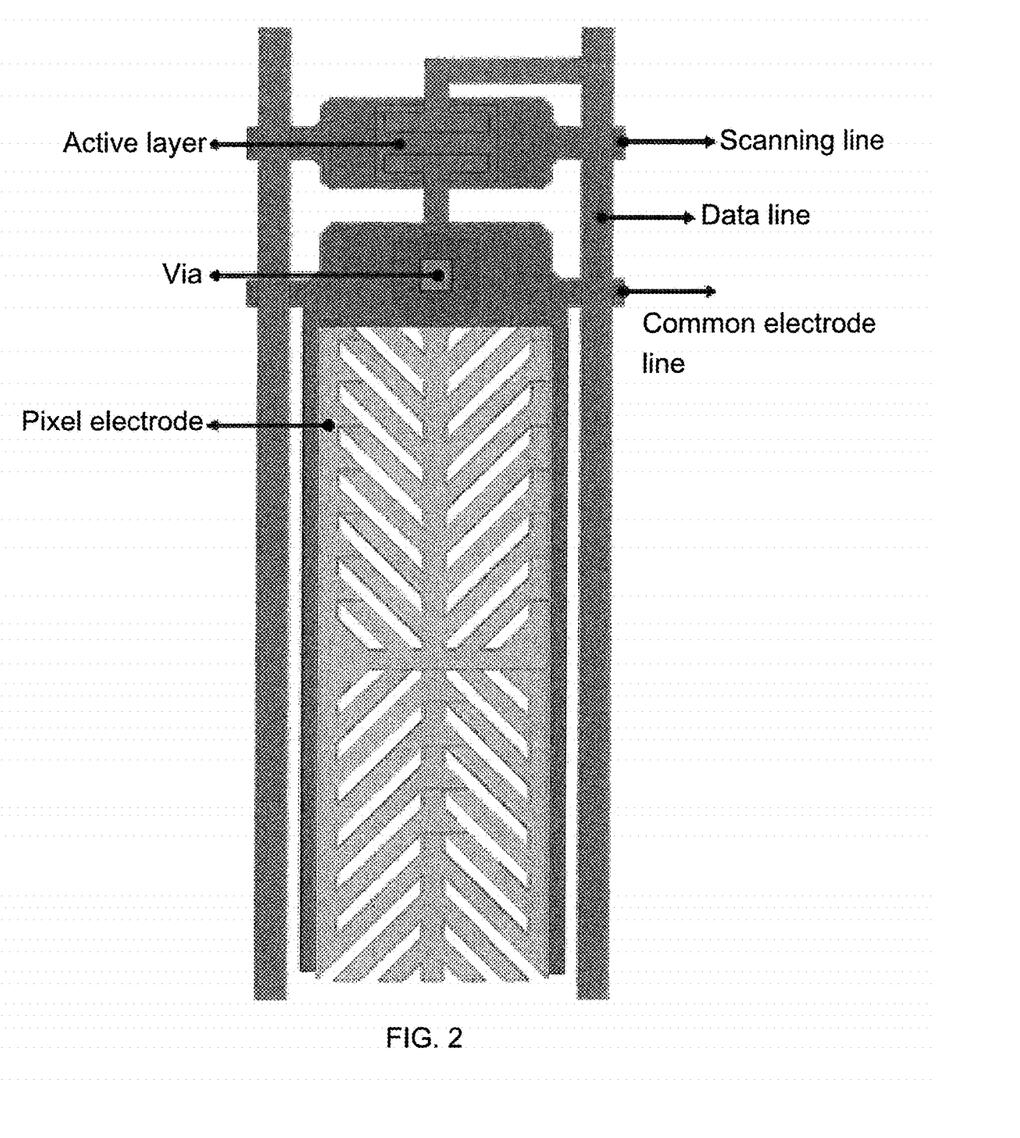
FIG. 2 shows the structure diagram of the pixel structure based on the conventional five photo-mask processes.

FIG. 2 shows the structure diagram of the pixel structure based on the conventional five photo-mask processes. A VA pixel structure is shown in the figure. In addition to the VA pixel, it can be other pixel structures such as IPS. The active layer and its surrounding gate, source and drain electrodes constitute a thin film transistor that drives the pixel electrode. The pixel electrode and source/drain electrodes are connected to each other with vias. The liquid crystal display peripheral-driving circuit mainly includes the scanning lines (Gate line), data lines (Data line), and common electrode lines (Com line).

The high-resolution liquid crystal displays based on the above technology have the following disadvantages:

1. The connection between the source/drain electrodes and pixel electrode inside the pixel requires the vias. In the high-resolution liquid crystal displays, the vias reduces the LCD display aperture ratio, thereby affecting the LCD liquid crystal efficiency.

2. In the liquid crystal display peripheral-driving circuit, the connection between the first metal layer and the second metal layer needs to use ITO Bridge, the bridge structure increases the frame width, especially to increase the area of GOA circuit, and ITO Bridge structure also increases the bridge impedance, thereby affecting the electrical characteristics of the panels.

SUMMARY OF THE INVENTION

Hence, the object of the present invention is to provide a manufacturing method of an array substrate, which enhances the transmittance of a high-resolution liquid crystal display and reduces the frame width.

Another object of the present invention is to provide an array substrate, which enhances the transmittance of a high-resolution liquid crystal display and reduces the frame width.

In order to achieve the objective, the present invention provides a manufacturing method of an array substrate, which comprises:

Step 1, a substrate is provided, a first metal layer is manufactured on the substrate, and the first metal layer is patterned with a first photo-mask, to manufacture a gate electrode.

Step 2, a gate insulating layer is manufactured on the substrate; an active layer is manufactured with a second photo-mask.

Step 3, a first via is formed in the gate insulating layer corresponding to the first metal layer with a third photo-mask.

Step 4, a second metal layer is manufactured on the gate insulating layer, the second metal layer is patterned with a fourth photo-mask, to manufacture source/drain electrodes, and a second via is formed on where corresponding to the active layer, the first metal layer and the second metal layer are connected at the first via.

Step 5, a pixel electrode is manufactured with a fifth photo-mask, the pixel electrode and the source/drain electrodes are directly connected at the second via; the second metal layer is covered and protected by the pixel electrode.

Wherein the array substrate is an array substrate of a vertical alignment (VA) type liquid crystal display.

Wherein the array substrate is an array substrate of an in-plane switching (IPS) type liquid crystal display.

Wherein the pixel electrode is made of indium tin oxide.

Wherein in the step 1, scanning lines and common electrode lines are further formed after patterning the first metal layer.

Wherein in the step 4, data lines are further formed after patterning the second metal layer.

Wherein the pixel electrode is made of indium tin oxide.

The present invention further provides an array substrate structure, which comprises: a substrate which is manufactured layer-by-layer, a first metal layer, a gate electrode, a gate insulating layer, an active layer, a second metal layer, source/drain electrodes and a pixel electrode. A first via is formed in the gate insulating layer corresponding to the first metal layer, a second via is formed on where corresponding to the active layer. The first metal layer and the second metal layer are connected at the first via. The pixel electrode and the source/drain electrodes are directly connected at the second via. The second metal layer is covered and protected by the pixel electrode.

Wherein the array substrate is an array substrate of a vertical alignment (VA) type liquid crystal display.

Wherein the array substrate is an array substrate of an in-plane switching (IPS) type liquid crystal display.

The present invention further provides a manufacturing method of an array substrate, which comprises:

Step 1, a substrate is provided, a first metal layer is manufactured on the substrate, and the first metal layer is patterned with a first photo-mask, to manufacture a gate electrode.

Step 2, a gate insulating layer is manufactured on the substrate; an active layer is manufactured with a second photo-mask.

Step 3, a first via is formed in the gate insulating layer corresponding to the first metal layer with a third photo-mask.

Step 4, a second metal layer is manufactured on the gate insulating layer, the second metal layer is patterned with a fourth photo-mask, to manufacture source/drain electrodes, and a second via is formed on where corresponding to the active layer, the first metal layer and the second metal layer are connected at the first via.

Step 5, a pixel electrode is manufactured with a fifth photo-mask, the pixel electrode and the source/drain electrodes are directly connected at the second via; the second metal layer is covered and protected by the pixel electrode.

Wherein in the step 1, scanning lines and common electrode lines are further formed after patterning the first metal layer.

Wherein in the step 4, data lines are further formed after patterning the second metal layer.

Summary, the array substrate structure and the manufacturing method of an array substrate of the invention can enhance the aperture ratio of the pixel at high-resolution and the display effect and quality of the liquid crystal display and improve the electrical characteristics of the panel.

BRIEF DESCRIPTION OF THE DRAWINGS

For better understanding the technical proposals and other beneficial effects of the present invention, please refer the following detailed description of the present invention with the accompanying drawings.

In drawings.

DETAILED DESCRIPTION OF THE PREFERRED EMBODIMENTS

Figure 6:
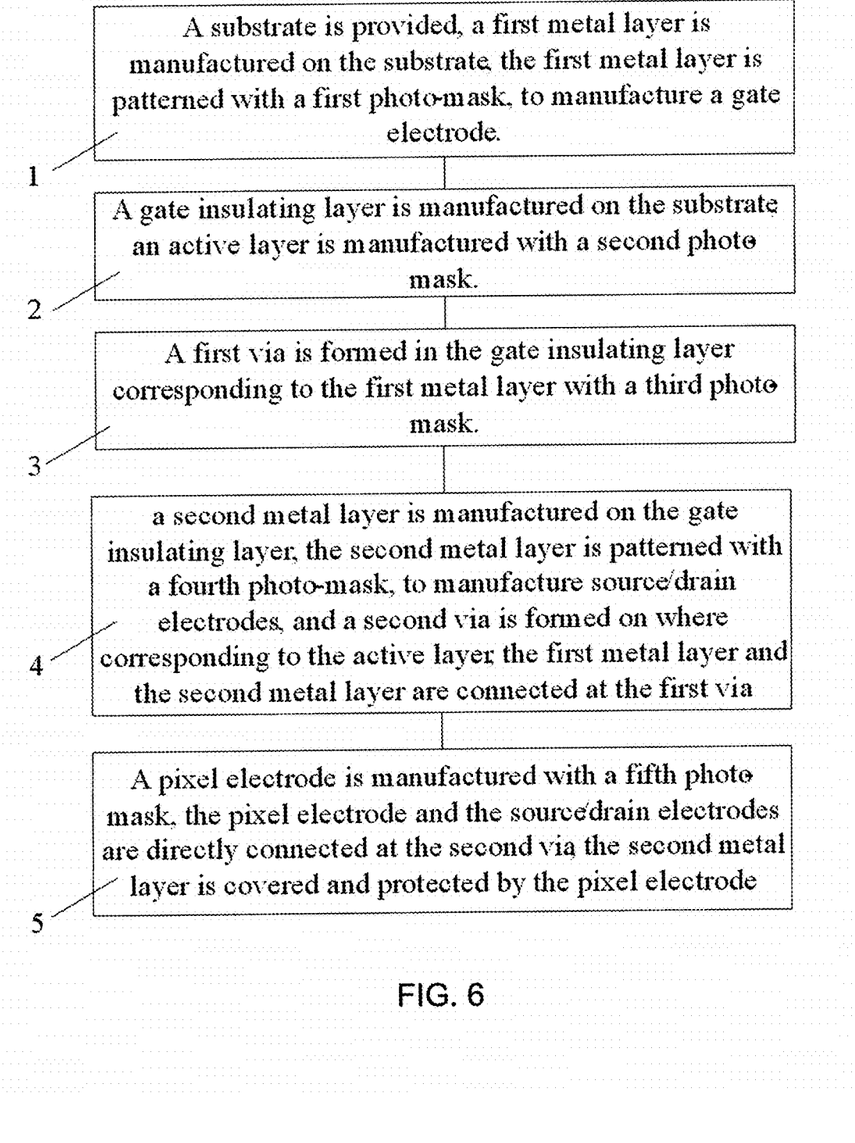
FIG. 6 is a flow diagram of a manufacturing method of an array substrate according to the present invention.

Please refer to FIG. 6, which is a flow diagram of a manufacturing method of an array substrate according to the present invention. The method mainly comprises:

Step 1, a substrate is provided, a first metal layer is manufactured on the substrate, and the first metal layer is patterned with a first photo-mask, to manufacture a gate electrode.

Step 2, a gate insulating layer is manufactured on the substrate; an active layer is manufactured with a second photo-mask.

Step 3, a first via is formed in the gate insulating layer corresponding to the first metal layer with a third photo-mask.

Step 4, a second metal layer is manufactured on the gate insulating layer, the second metal layer is patterned with a fourth photo-mask, to manufacture source/drain electrodes, and a second via is formed on where corresponding to the active layer, the first metal layer and the second metal layer are connected at the first via.

Step 5, a pixel electrode is manufactured with a fifth photo-mask, the pixel electrode and the source/drain electrodes are directly connected at the second via; the second metal layer is covered and protected by the pixel electrode.

The present invention provides a new manufacturing process of the array substrate of the liquid crystal display, in the process, the first metal layer and the second metal layer are directly connected with the vias, the second metal layer is covered and protected by the indium tin oxide (ITO). The liquid crystal displays based on this manufacturing process have high pixel aperture ratio, narrow frames and other advantages.

Figure 3:
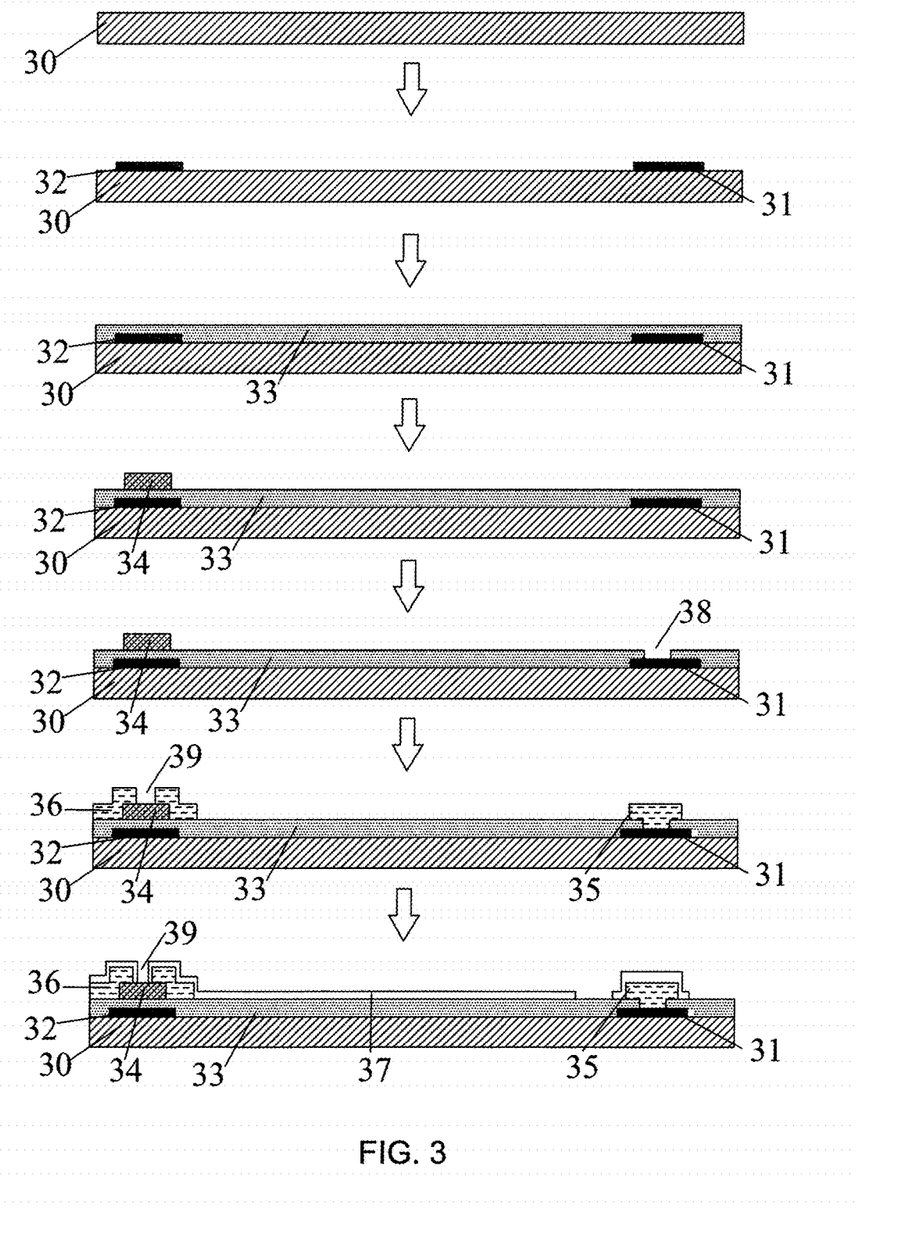
FIG. 3 is an illustrative diagram of a manufacturing process of an array substrate according to the present invention.

Please refer to FIG. 3, which is an illustrative diagram of a manufacturing process of an array substrate according to the present invention, for further describing the manufacturing method of an array substrate according to the present invention.

A substrate 30 is provided, a first metal layer 31 is manufactured on the substrate 30, and the first metal layer 31 is patterned with a first photo-mask, to manufacture a gate electrode 32. Scanning lines and common electrode lines can be formed on where the first metal layer 31 excluding the gate electrode 32.

Then, a gate insulating layer 33 is manufactured on the substrate 30; an active layer 34 is manufactured with a second photo-mask.

A first via 38 is formed in the gate insulating layer 33 corresponding to the first metal layer 31 with a third photo-mask. The position of the first via 38 corresponds to the first metal layer 31 of the liquid crystal display peripheral-driving circuit.

A second metal layer 35 is manufactured on the gate insulating layer 33, the second metal layer 35 is patterned with a fourth photo-mask, to manufacture source/drain electrodes 36, and a second via 39 is formed on where corresponding to the active layer 34, the first metal layer 31 and the second metal layer 35 are connected at the first via 38, data lines and the like may be formed on where the second metal layer 35 excluding the source/drain electrodes 36.

A pixel electrode 37 is manufactured with a fifth photo-mask, the pixel electrode 37 and the source/drain electrodes 36 are directly connected at the second via 39, the second metal layer 35 is covered and protected by the pixel electrode 37, and the pixel electrode 37 may be formed by indium tin oxide (ITO).

According to the manufacturing method of an array substrate of the present invention, the present invention provides a corresponding array substrate structure as FIG. 3, which comprises a substrate 30 which is manufactured layer-by-layer, a first metal layer 31, a gate electrode 32, a gate insulating layer 33, an active layer 34, a second metal layer 35, source/drain electrodes 36 and a pixel electrode 37. A first via 38 is formed in the gate insulating layer 33 corresponding to the first metal layer 31; a second via 39 is formed on where corresponding to the active layer 34. The first metal layer 31 and the second metal layer 35 are connected at the first via 38. The pixel electrode 37 and the source/drain electrodes 36 are directly connected at the second via 39. The second metal layer 35 is covered and protected by the pixel electrode 37.

Figure 4:
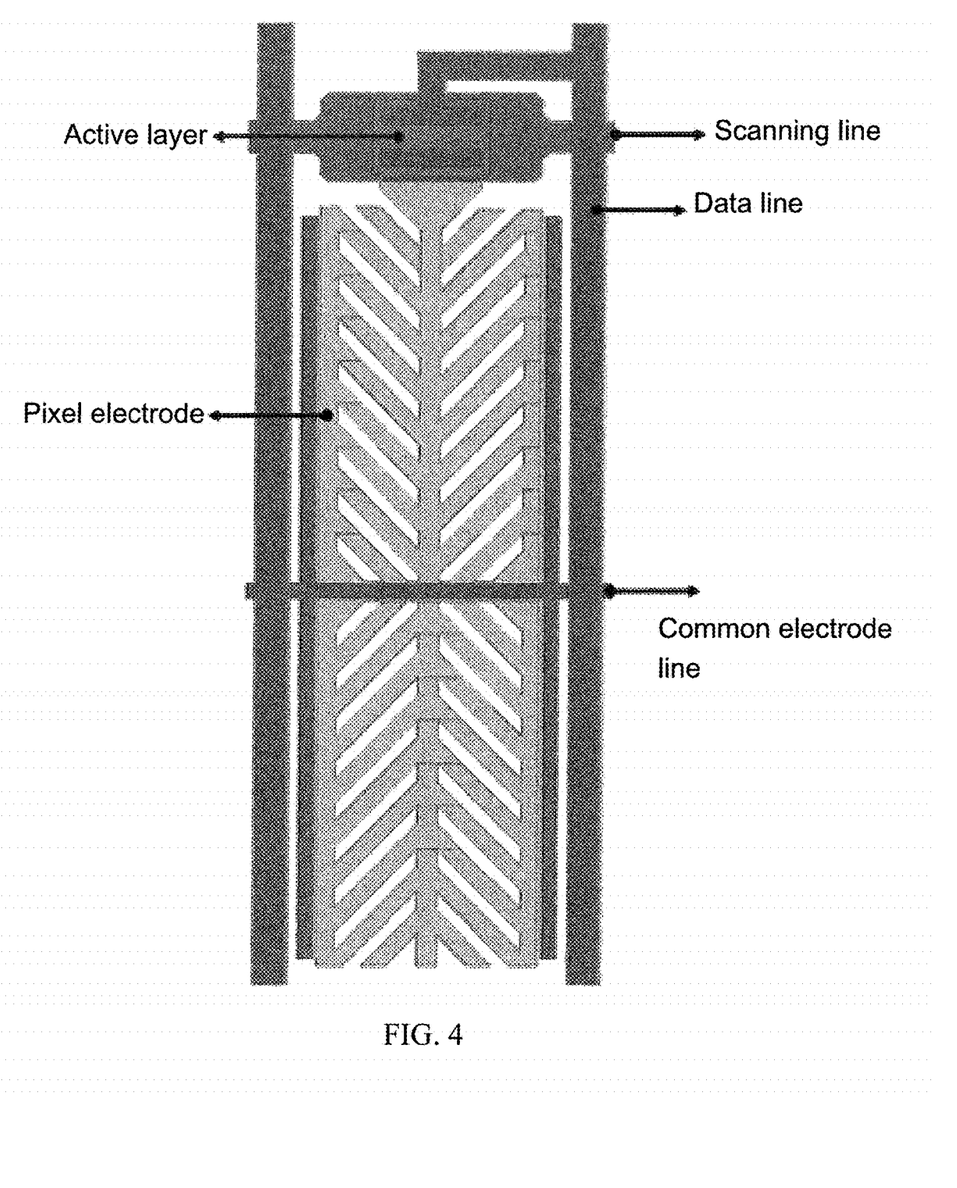
FIG. 4 is an illustrative diagram of a pixel structure of an array substrate according to the present invention.

Please refer to FIG. 4, which is an illustrative diagram of a pixel structure of an array substrate according to the present invention. A Vertical Alignment (VA) pixel structure is shown in the figure. In addition to the VA pixel, it can be other pixel structures such as In-Plane Switching (IPS). The active layer and its surrounding gate, source and drain electrodes constitute a thin film transistor that drives the pixel electrode. The pixel electrode and source/drain electrodes are directly connected to each other with vias on the active layer. The liquid crystal display peripheral-driving circuit mainly includes the scanning lines (Gate line), data lines (Data line), and common electrode lines (Com line).

The high-resolution liquid crystal displays based on the above technology have the following advantages:

1. The connection between the source/drain electrodes and pixel electrode inside the pixel is directly done by the vias. In the high-resolution liquid crystal displays, the vias enhances the LCD display aperture ratio, thereby enhancing the LCD liquid crystal efficiency.

2. In the liquid crystal display peripheral-driving circuit, the connection between the first metal layer and the second metal layer does not need to use ITO Bridge, the bridging method of the present invention decreases the frame width, especially to decrease the area of GOA circuit, and ITO Bridge structure also decreases the bridge impedance, thereby enhancing the electrical characteristics of the panels.

Figure 5:
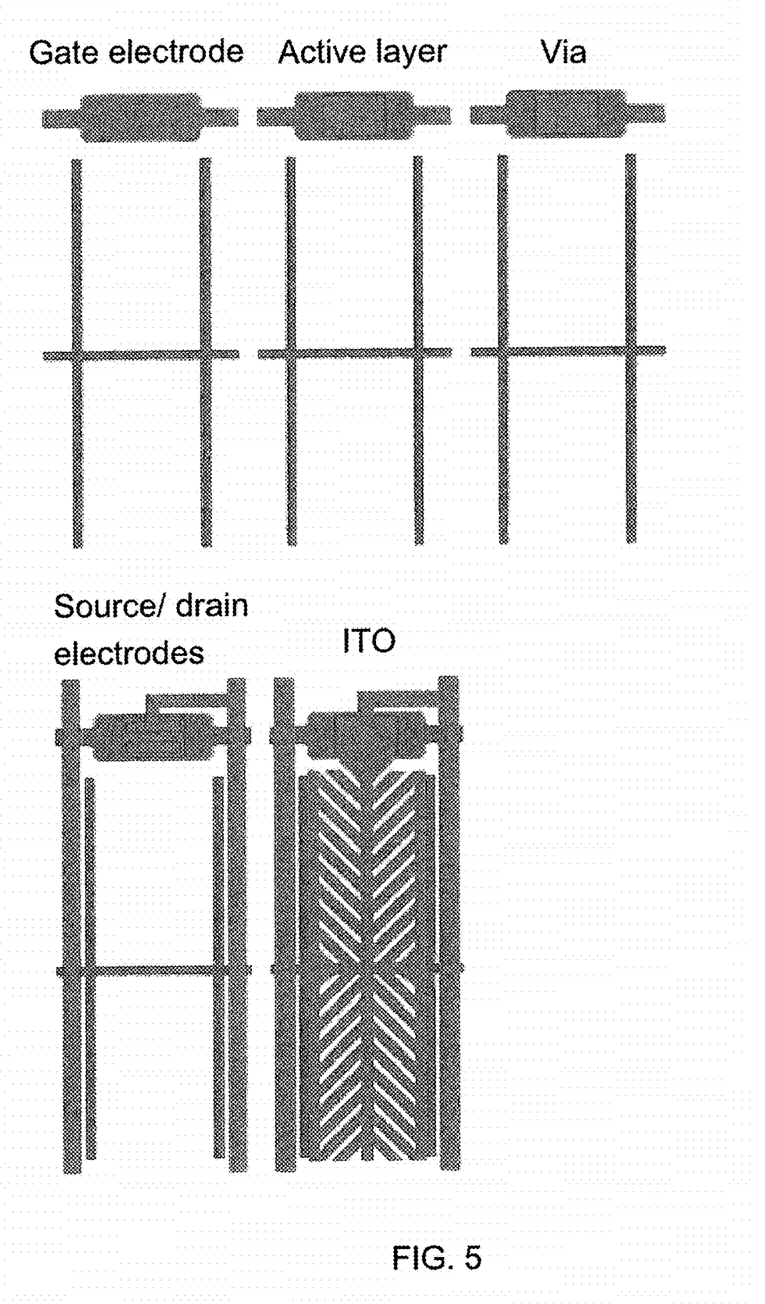
FIG. 5 is an illustrative stratified diagram of a pixel structure of an array substrate according to the present invention.

Please refer to FIG. 5, which is an illustrative stratified diagram of a pixel structure of an array substrate according to the present invention. The structure of the pixel in FIG. 4 is described layer-by layer, which can correspond to five photo-mask processes. A first photo-mask process, a gate electrode and a remaining first metal layer pattern are formed, the remaining first metal layer pattern may include scanning lines and common electrode lines. A second photo-mask process, an active layer is formed on where corresponding to the gate electrode. A third photo-mask process, a via is formed on the remaining first metal layer. A fourth photo-mask process, source/drain electrodes are formed. A fifth photo-mask process, a pixel electrode is formed and a second metal layer is covered and protected with indium tin oxide.

Summary, the array substrate structure and the manufacturing method of an array substrate of the invention can enhance the aperture ratio of the pixel at high-resolution and the display effect and quality of the liquid crystal display and improve the electrical characteristics of the panel.

As mentioned above, those of ordinary skill in the art, without departing from the spirit and scope of the present disclosure, can make various kinds of modifications and variations to the present disclosure. Therefore, all such modifications and variations are intended to be included in the protection scope of the appended claims of the present invention.

What is claimed is:

1. A manufacturing method of an array substrate, comprising:
    step 1, providing a substrate, manufacturing a first metal layer on the substrate, patterning the first metal layer with a first photo-mask, to manufacture a gate electrode;
    step 2, manufacturing a gate insulating layer on the substrate, manufacturing an active layer with a second photo-mask;
    step 3, forming a first via in the gate insulating layer corresponding to the first metal layer with a third photo-mask;
    step 4, manufacturing a second metal layer on the gate insulating layer, patterning the second metal layer with a fourth photo-mask, to manufacture source/drain electrodes, and forming a second via on where corresponding to the active layer, the first metal layer and the second metal layer being connected at the first via;
    step 5, manufacturing a pixel electrode with a fifth photo-mask, the pixel electrode and the source/drain electrodes being directly connected at the second via, the second metal layer being covered and protected by the pixel electrode.

2. The manufacturing method of an array substrate according to claim 1, wherein the array substrate is an array substrate of a vertical alignment (VA) type liquid crystal display.

3. The manufacturing method of an array substrate according to claim 1, wherein the array substrate is an array substrate of an in-plane switching (IPS) type liquid crystal display.

4. The manufacturing method of an array substrate according to claim 1, wherein the pixel electrode is made of indium tin oxide.

5. The manufacturing method of an array substrate according to claim 1, wherein in the step 1, scanning lines and common electrode lines are further formed after patterning the first metal layer.

6. The manufacturing method of an array substrate according to claim 1, wherein in the step 4, data lines are further formed after patterning the second metal layer.

7. A manufacturing method of an array substrate, comprising:
    step 1, providing a substrate, manufacturing a first metal layer on the substrate, patterning the first metal layer with a first photo-mask, to manufacture a gate electrode;
    step 2, manufacturing a gate insulating layer on the substrate, manufacturing an active layer with a second photo-mask;
    step 3, forming a first via in the gate insulating layer corresponding to the first metal layer with a third photo-mask;
    step 4, manufacturing a second metal layer on the gate insulating layer, patterning the second metal layer with a fourth photo-mask, to manufacture source/drain electrodes, and forming a second via on where corresponding to the active layer, the first metal layer and the second metal layer being connected at the first via;
    step 5, manufacturing a pixel electrode with a fifth photo-mask, the pixel electrode and the source/drain electrodes being directly connected at the second via, the second metal layer being covered and protected by the pixel electrode;

wherein in the step 1, scanning lines and common electrode lines are further formed after patterning the first metal layer;

wherein in the step 4, data lines are further formed after patterning the second metal layer.

8. The manufacturing method of an array substrate according to claim 7, wherein the array substrate is an array substrate of a vertical alignment (VA) type liquid crystal display.

9. The manufacturing method of an array substrate according to claim 7, wherein the array substrate is an array substrate of an in-plane switching (IPS) type liquid crystal display.

10. The manufacturing method of an array substrate according to claim 7, wherein the pixel electrode is made of indium tin oxide.

* * * * *